United States Patent [19]

Tanner et al.

[11] Patent Number: 4,958,349
[45] Date of Patent: Sep. 18, 1990

[54] HIGH DATA RATE BCH DECODER

[75] Inventors: Robert M. Tanner, Capitola; Richard Koralek; Frank Chethik, both of Palo Alto; Stephen B. Lengel, Cupertino; David H. Miller, Sacramento, all of Calif.

[73] Assignee: Ford Aerospace Corporation, Newport Beach, Calif.

[21] Appl. No.: 265,625

[22] Filed: Nov. 1, 1988

[51] Int. Cl.⁵ .................................... G06F 11/10
[52] U.S. Cl. ..................... 371/37.1; 371/37.8
[58] Field of Search ............... 371/37.1, 37.2, 37.4, 371/37.5, 37.6, 37.3, 37.8

[56] References Cited

U.S. PATENT DOCUMENTS

| | | | |
|---|---|---|---|
| 4,162,480 | 7/1979 | Berlekamp | 371/37.1 |
| 4,410,989 | 10/1983 | Berlekamp | 371/39.1 |
| 4,509,172 | 4/1985 | Chen | 371/37.8 |
| 4,564,944 | 1/1986 | Arnold | 371/37.8 |
| 4,597,083 | 6/1986 | Stenerson | 371/37.2 |
| 4,623,999 | 11/1986 | Patterson | 371/37.8 |
| 4,644,343 | 2/1987 | Davis | 371/37.8 |
| 4,649,541 | 3/1987 | Lahmeyer | 371/37.1 |
| 4,665,523 | 5/1987 | Citron et al. | 371/37.1 |
| 4,683,571 | 7/1987 | Yamagishi | 371/37.8 |
| 4,694,455 | 9/1987 | Kaga | 371/37.1 |
| 4,747,103 | 5/1988 | Iwamura et al. | 371/37.4 |

OTHER PUBLICATIONS

Okano and Imai, "A Construction Method of High-Speed Decoders Using ROM's for Bose-Chaudhuri-Hocquenghem and Reed-Solomon Codes", IEEE Transactions on Computers, vol. C-36, No. 10, Oct. 1987, pp. 1165-1171.

Primary Examiner—Michael R. Fleming
Attorney, Agent, or Firm—Townsend and Townsend

[57] ABSTRACT

A decoder for selected linear error correcting codes, such as a BCH code, uses relatively low-speed circuitry to determine syndromes and corresponding error locations for correcting the code. In a specific embodiment of a BCH linear cyclic invariant error correcting code, only cyclic invariants are stored in Read Only Memory such that the storage requirements of the Read Only Memory are minimized, and table look-up techniques are employed to speed apparent computation. In another specific embodiment of a linear error correcting codes, a Read Only Memory is used to store precomputed indicia of possible errors in the code word, and table look-up techniques are employed to determine one or more syndromes. The table look-up method avoids the complexity of error locating polynomials, algebraic root finders and real-time computation while reducing computation time. The apparatus may be constructed making maximum use of the standard, commercially available, relatively low-cost integrated circuits, but it is nevertheless capable of operating at speeds in excess 1 GBPS.

22 Claims, 4 Drawing Sheets

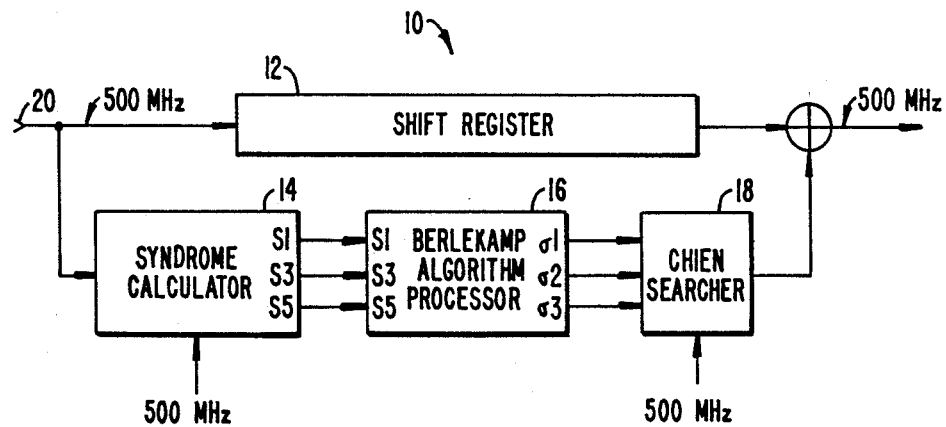
FIG._1.
PRIOR ART
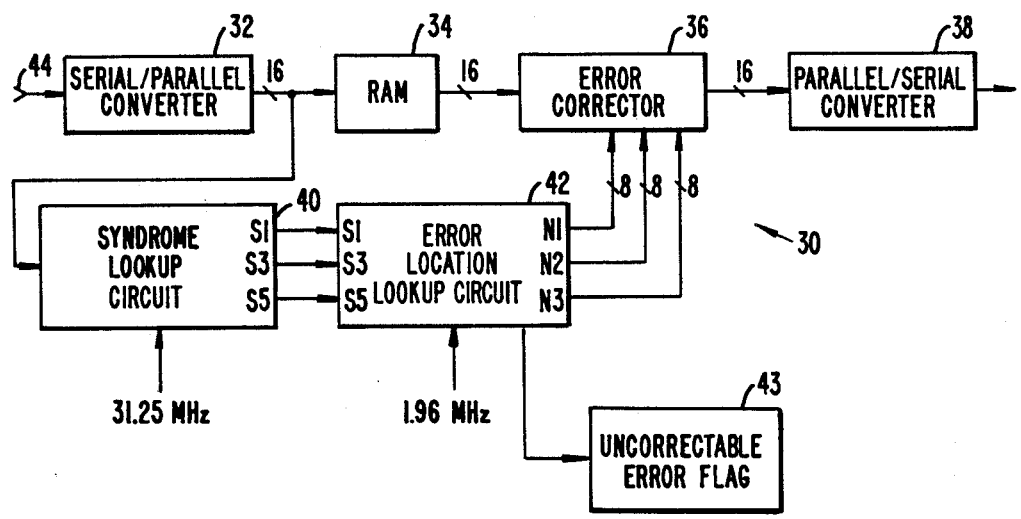
FIG._2.

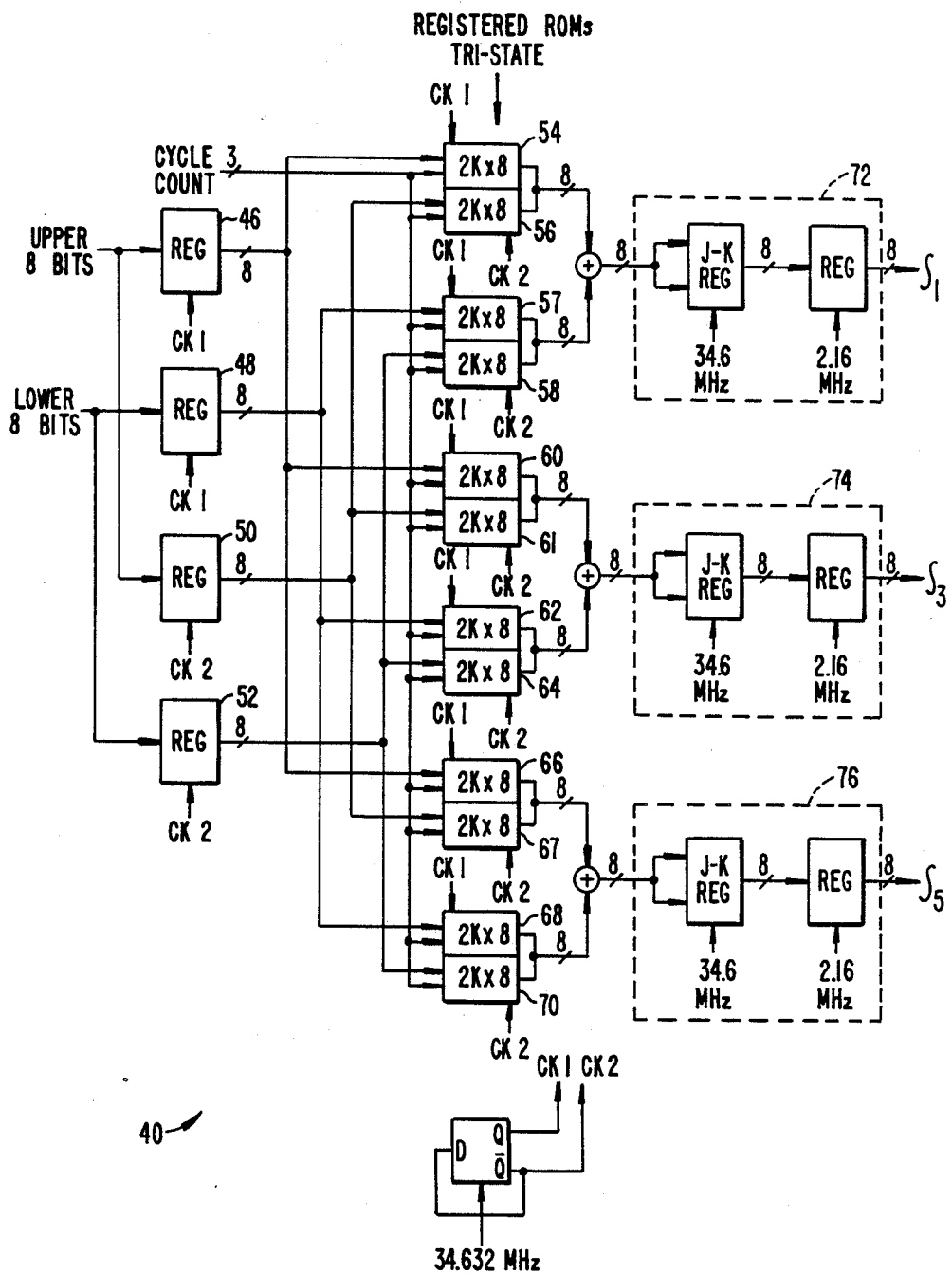
FIG._3.

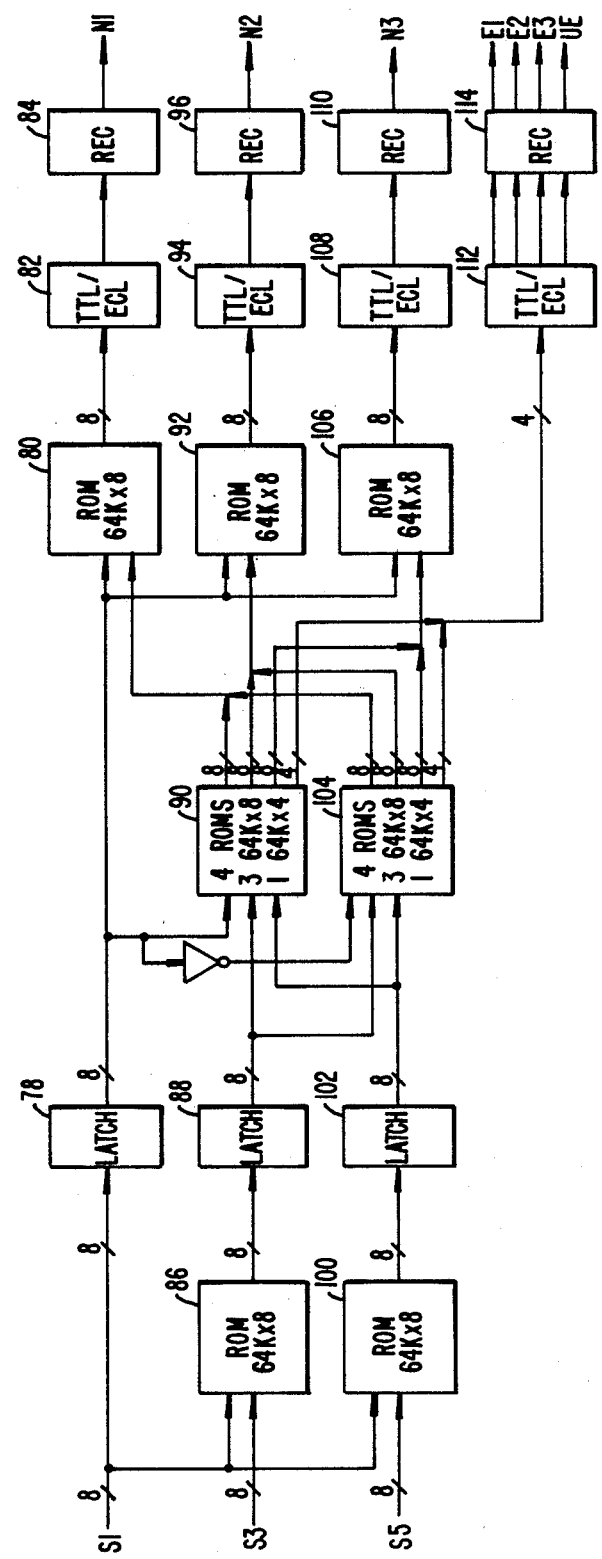
FIG._4.

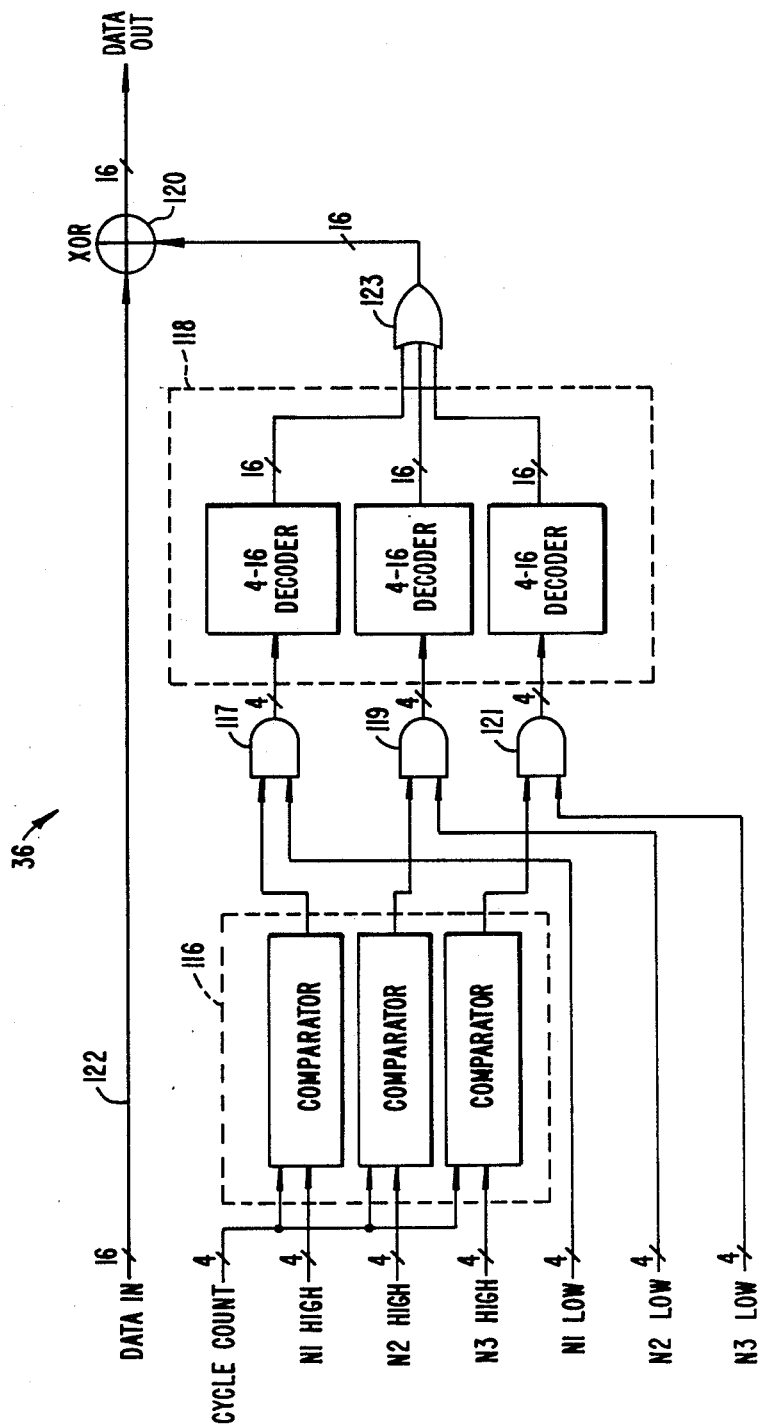
FIG._5.

HIGH DATA RATE BCH DECODER

BACKGROUND OF THE INVENTION

This invention relates to error detection and correction of data encoded in an error correcting code, and more particularly this invention relates to decoding data that has been coded with a linear code or with selected linear cyclic codes whose generator polynomials can be factored and wherein the data rate for decoding is higher than the computation capabilities of the computation apparatus employing direct decoding techniques. A primary example of a suitable code is a BCH code.

A BCH (Bose-Chaudhuri-Hocquenghem) code is an example of a code which can be used for correcting error bits in input data. These and other complex and powerful codes found use in satellite communication links and the like where error correction can be employed to mitigate the effects of noise interference. Such codes, however, require complex decoding algorithms to reconstruct the information from a received signal. The complex decoding algorithms have typically been implemented by special-purpose computers which perform computations in real time.

As the need for very high-speed decoders has developed, the limitation of the computation technology has become apparent. Even with the most sophisticated high-speed digital logic circuits, the highest achievable data rate appears to be less than about 500 MBPS. There is nevertheless a need to develop decoders capable of decoding information in real time at rates in excess of 1 GBPS.

In order to understand the complexity of the problem, a brief explanation of the background and theory of the underlying encoding scheme is helpful. Reference may be had to works such as Berlekamp, *Algebraic Coding Theory*, (McGraw-Hill, 1968) or Lin & Costello, Jr., *Error Control Coding*, (Prentice-Hall, 1983).

A binary Bose-Chaudhuri-Hocquenghem code (or simply a BCH code) is a class of error detecting and error correcting codes having a code word length of $N = 2^m - 1$ where each symbol has m bits. The generator polynomial $g(x)$ is given by the form:

$$g(x) = 1 + X^2 + X^4 + X^5 + X^7 + X^8 + X^{13} + X^{15} + X^{16} + X^{17} + X^{19} + X^{20} + X^{21} + X^{23} + X^{24}$$

for a basic code having a code word or block length of 255 bits, of which 231 bits are information bits and 24 bits are parity check bits. The minimum distance of this code is $D = 7$. The generator polynomial is a product of the minimum polynomials $M_1(x)$, $M_3(x)$, and $M_5(x)$ of the roots $\alpha$, $\alpha^3$, and $\alpha^5$, as specified by the BCH code construction. The $\alpha$ is the primitive element of the Galois field, which in the case of this basic code is the Galois field $GF(2^8)$.

While the invention applies to linear error correcting codes and in specific embodiments to selected linear cyclic invariant codes whose generator polynomials can be factored, in order to simplify the explanation of the invention, the invention will be described specifically with respect to a triple-error-correcting binary BCH code. There are also special cases of BCH codes, such as Reed-Solomon codes, to which the concepts of the present invention may be applied.

The inventors wish to call attention to the following references by way of background for the present invention. Not all of the references herein cited are necessarily prior art to the present invention.

| Author | U.S. Pat. No. | Issue Date |
|---|---|---|
| Berlekamp | 4,162,480 | 07-24-79 |
| Berlekamp | 4,410,989 | 10-18-83 |
| Citron et al. | 4,665,523 | 05-12-87 |
| Stenerson | 4,597,083 | 06-24-86 |
| Lahmeyer | 4,649,541 | 05-10-87 |
| Kaga | 4,694,455 | 09-15-87 |
| Iwanmura et al. | 4,747,103 | 05-24-88 |

PAPER

Okano and Imai, "A Construction Method of High-Speed Decoders Using ROM's for Bose-Chaudhuri-Hocquenghem and Reed-Solomon Codes", *IEEE Transactions on Computers*, Vol. C-36, No. 10, Oct. 1987, pp. 1165–1171.

Heretofore, virtually al-1 BCH decoders have been based on an algorithm first described by Berlekamp, as noted in the Okano reference above. The Berlekamp algorithm is a computation-intensive algorithm which was originally developed for relatively low-speed decoders. Referring to FIG. 1, there is shown a block diagram of a prior art BCH decoder 10 which employs direct calculations of the syndromes and error locations. It comprises a shift register 12, a syndrome calculator 14, a Berlekamp algorithm processor 16 and a Chien Searcher 18. Received data at input 20 is shifted through a long delay line of the shift register 12 while decoding computations are being performed in the syndrome calculator 14, Berlekamp algorithm processor 16, and Chien Searcher 18. The data exits the delay line synchronously with the decoding computations, and any bits in error are inverted as they are being read out. The delay line can be implemented either as a conventional shift register or as a random access memory with an appropriate address generator.

The four steps of operation of a conventional BCH decoder are employed therein, namely: (1) computation of the syndromes; (2) computation of the error location polynomial; (3) computation of the error location numbers; and (4) correction of the errors.

The first step in the decoding computations is to compute the syndrome, or in the case of a triple-error-correcting BCH code, the three syndromes, referred to as S1, S3 and S5. There are 24 bits in the syndromes in this illustration, which are the result of computations according to 24 parity check equations carried out on the received bits. The three syndromes are the remainders after the received polynomial is divided by the polynomials $M_1(x)$, $M_3(x)$ and $M_5(x)$.

The syndromes are the values which contain the information needed to identify and locate any errors, and the syndromes are usually computed by dividing the received polynomial by the minimum polynomials using feedback shift registers. The received bits are shifted through the register 12. For example register 12 contains the value of S1 after the last shift.

Implementation of such a circuit at high speeds of interest, namely, greater than 500 MBPS, is extremely difficult because the propagation delay of a typical flip-flop plus the propagation delay of an EXCLUSIVE OR gate plus the setup time of the next flip-flop stage must be less than 2 nanoseconds. With currently-available commercial technology, this is possible only using expensive high-speed digital GaAs circuitry, and integrated circuits operating at speeds sufficient to support computation for data rates of greater than 1 GBPS are considered impossible to realize given the current state of the art of both digital circuitry and digital microwave techniques. Even if such circuitry were available, the current state-of-the-art techniques would require that each be individually customized, thereby essentially precluding the commercial development and large-volume availability of devices incorporating a high-speed BCH encoder.

The need for a high-speed feedback shift register is not the only technological limitation. Once the syndromes have been calculated, the information needed to correct errors exists. However, the syndromes do not directly indicate the location of the bits in error. A transformation must be applied to translate the syndrome pattern into a set of error locations.

The conventional technique for translating syndrome patterns into error locations is a two-step approach using as a first step the Berlekamp algorithm referenced above, which translates the three syndromes into three error locator polynomial coefficients, and as a second step a translation of the polynomial coefficients into the actual error correction pulses coinciding in time with the bit that is to be corrected upon readout of the delay line. To provide the bit synchronization, a Chien Searcher is employed, as noted in FIG. 1. While the Berlekamp algorithm can be performed at relatively high speeds using a series of interconnected feedback shift registers, the Chien Searcher, even when implemented using several feedback shift registers, is subject to the same problems as the syndrome calculator, since it must also operate at the output data rate.

The use of a Read Only memory (ROM) has been suggested by Imai et al. in connection with the realization of high-speed BCH decoders. However, ROMs have only been suggested for use in support of the specialized computations of the conventional four-step decoding method without departing substantially from the conventional decoding procedure.

In view of the limitations in the conventional approach to the solution of the BCH decoding problem, it is apparent that what is needed is an approach to decode BCH and like codes at speeds which are not limited by the computation apparatus.

SUMMARY OF THE INVENTION

In accordance with the invention, a decoder is provided for selected linear error correcting codes whose generator polynomials can be factored, such as a BCH code, and which uses relatively low-speed circuitry to determine syndromes and corresponding error locations for correcting the code. In a specific embodiment of a linear cyclic invariant error correcting code, only cyclic invariants are stored in Read Only Memory such that the storage requirements of the Read Only Memory are minimized, and table look-up techniques are employed to speed apparent computation. In another specific embodiment of linear error correcting codes where factorability is not relevant, a Read Only Memory is used to store precomputed indicia of possible errors in the code word, and table look-up techniques are employed to determine one or more syndromes. The table look-up method avoids the complexity of error locating polynomials, algebraic root finders and real-time computation while reducing computation time. The apparatus may be constructed making maximum use of the standard, commercially- available, relatively low-cost integrated circuits, but it is nevertheless capable of operating at speeds in excess 1 GBPS. In a specific embodiment, the required clock rate is reduced by a factor of sixteen by converting one channel of serial data to sixteen channels of parallel data.

The invention will be more fully understood by reference to the following detailed description in connection with the accompanying drawings.

BRIEF DESCRIPTION OF THE DRAWINGS

FIG. 1. is a block diagram of a prior art decoder.

FIG. 2 is a block diagram of a decoder in accordance with the invention.

FIG. 3 is a block diagram of a syndrome computation circuit using Read Only Memories (ROMs) in accordance with the invention.

FIG. 4 is a block diagram of an error look-up circuit using ROMs in accordance with the invention.

FIG. 5 is a block diagram of an error correction circuit used in accordance with the invention.

DESCRIPTION OF SPECIFIC EMBODIMENTS

Referring to FIG. 2, there is shown a block diagram of a BCH decoder 30 in accordance with the invention capable of operation at data rates in excess of 1 GBPS largely using conventional digital integrated circuit components. In the specific embodiment shown, the nominal data rate is 500 MHz, the word length is sixteen bits, and the code is a triple error correcting code. Different data rates, different word lengths and a different level of error correcting code may be implemented without departing from the spirit and scope of the invention.

In the specific embodiment shown, the decoder comprises a serial-to-parallel converter 32, coupled to a Random Access Memory (RAM) 34, in turn coupled to an error corrector 36, which is coupled to a parallel-to-serial converter 38. The output of the serial-to-parallel converter 32 is also coupled to a syndrome look-up circuit 40 with Read Only Memory (ROM) which in turn is coupled to an error locatiOn look-up circuit 42 with ROM. The error location look-up circuit 42 provides data output to the error corrector 36 and provides signals for word synchronization and indications of uncorrectable errors, error count and the like. In the specific embodiment shown, the BCH decoder provides decoding for a signal needing three syndromes to determine and locate errors.

The serial-to-parallel converter 32, in this example a sixteen-bit converter, operates to convert the high-speed input data at an input port 44 into sixteen parallel data streams, reducing the clock rate by a factor of sixteen. This effective clock rate reduction brings the signal processing rate into the range of ECL circuitry, TTL circuitry and high-speed CMOS circuitry. However, to accommodate the high input data rates, the serial-to-parallel converter 32 is preferably implemented by a chain of shift registers constructed of GaAs components, or more preferably, by an available standard GaAs integrated circuit which not only integrates the functions of serial to parallel conversion but also clock division and clock pulse slipping for synchronization. The parallel-to-serial converter 38 is preferably a companion GaAs integrated circuit. Versions of the GaAs integrated circuits are available with speed ratings to 1.5 GHz.

The RAM 34 is a high-speed CMOS, TTL, or ECL semiconductor memory used for temporary storage of input data to implement the needed delay function allowing pipelined decoding functions to be completed. After a preselected delay, the temporarily-stored data is read out to the error corrector 36 which uses the decoding calculation results to invert the bits which are in error. The corrected data is provided to the parallel-to-serial converter 38 for output as a serial bit stream.

The decoding of the parallel data is handled through the use of look-up circuits operating at relatively modest data rates. For a 500 BPS input signal, the data rate for decoding is 31.25 MBPS or 1/16th the input signal data rate.

The decoding process, which in the past has required direct computation of the syndromes, is accomplished according to the invention by use of a syndrome look-up circuit 40. The syndromes are dependent only on the received error pattern and not on the underlying data. The syndromes represent the most compact description of the error pattern which can be computed with realizable hardware. According to the invention, the syndromes can be precomputed and stored in a form suitable for retrieval by table look-up techniques.

Computation of the syndromes if in real time would be as follows. The BCH code has a characteristic H matrix describing the parity check equations which make up the syndrome calculations. Specifically, by definition: $cH^T=0$, where c is the code word and $H^T$ is the transpose of the H matrix. The received code is r, which is a combination of the code word c plus a linear combination of some error e, or $r=c+e$. The syndrome is given by: $S=rH^T=cH^T+eH^T=eH^T$. Thus, the syndrome error is depends only on the error pattern and not on the encoded information.

The H matrix for the BCH code of this example is a 24-row by 255-column matrix. The first eight rows correspond to the eight bits of the first syndrome $S_1$, the second eight rows correspond to the eight bits of the second syndrome $S_3$, and the third eight rows correspond to the eight bits of the third syndrome $S_5$.

The first row of the matrix represents the parity check equation for the first bit of $S_1$, the value of the first bit being given by the parity of the bit-by-bit product of the received code word and the first row of the H matrix, each of which are 255 bits long. The bit-by-bit product is the result of the Exclusive-O-Ring of the two. The received code word may be subdivided into sixteen-bit chunks, each of which may be processed in parallel with the corresponding sixteen-bit chunk of the corresponding row of the H matrix. After all sixteen partial parities have been computed (the 256th bit is ignored), they can be modulo-2 added to form the total parity, the result of which is the first bit of the first syndrome $s_1$. The same process is carried out for all of the other syndrome bits.

According to the invention, the syndrome look-up circuit 40, which may include sixteen ROMS in parallel, stores the pre-computed results of the syndrome calculation algorithm, namely, the parity of the bit-by-bit product of the appropriate 16 columns of the H matrix and the corresponding 16-bit data chunk. These parities are accumulated in modulo-2 accumulators (part of the syndrome look-up circuit 40), resulting in the correct eight-bit syndrome bits after sixteen repetitions. In the example, the three syndromes are provided as input to the error location look-up circuit 42.

The error location look-up circuit 42 contains ROM containing data in the form of tables to allow translation of the syndrome numbers into the bit numbers of the error locations. In one embodiment, the ROM in the error location look-up circuit 42 may be a large table which directly translates the three eight-bit syndromes into three eight-bit error location numbers using the syndromes as the look-up address of the look-up table. Given current technology, the size of such a look-up table would be considered prohibitive, as the table would have $2^{24}$ or nearly 17 million entries, each 24 bits long, or over 400 million bits of ROM data.

However, according to the invention, the size of the ROM in the error location circuit 42 may be minimized by recognizing and exploiting the cyclic invariance of the syndrome patterns. The BCH code has a characteristic cyclic property. For each pattern of errors, there is a unique pattern of syndromes $S_1$, $S_3$, and $S_5$. If the error pattern is shifted by i bits, the resulting syndromes will be $\alpha^i S_1$, $\alpha^{3i} S_3$, and $\alpha^{5i} S_5$. Thus, the syndrome patterns for all 255 cyclic shifts of a given error pattern are related and easily computed from a single example of an error pattern. According to the invention, the ROM in the error location look-up circuit 42 stores only one representation of the syndrome error pattern, herein referred to as the reference pattern, and all other shifts are computed by the relationship given by the degree of shift from the reference pattern. The size of the ROM in the error location look-up circuit 42 is effectively reduced by a factor of 255. A special case handles the situation where the syndrome is equal to zero.

In a specific embodiment, the table look-up algorithm operates as follows. Each error pattern is effectively shifted so that $S_1=1$. This is done by multiplying (shifting) the error pattern by the inverse of the first syndrome $S_1^{-1}$. This cyclic shift results in multiplying the second syndrome $S_3$ by the cube of the inverse of the first syndrome and in multiplying the third syndrome $S_5$ by the inverse of the first syndrome raised to the fifth power. Therefore, all resulting error patterns have $S_1-1$ and are therefore fully characterized by $(S_1^{-1})^3 S_3$ and $(S_1^{-1})^5 S_5$. The error location look-up table 42 for this part of the computation contains only $2^{16}$ or 64K words of data, which is an easily-realizable size.

The value of the original $S_1$ indicates the number of bits to be shifted back at the end of the decoding and is used to designate the position of the error patterns. In addition, the error location look-up circuit 42 must be provided with an additional 64K-word look-up table in a ROM for the special case of those error patterns for which $S_1=0$, since in that case the value for $S_1^{-1}$ would be undefined.

The error location look-up circuit 42 provides as an output three or fewer error location numbers $N_1$, $N_2$ and $N_3$, which numbers are fed to the error corrector 36. The error corrector 36 employs these numbers to correct (invert) the identified bits in the bit stream being fed (as 16 parallel processes) from the RAM 34. For uncorrectable errors, the error location lookup circuit 42 issues an uncorrectable error flag 43.

FIG. 3 illustrates in greater detail the syndrome look-up circuit 40 in accordance with the invention. The circuit 40 comprises a bank of input registers 46, 48, 50, and 52 separating the upper eight bits from the lower eight bits of the sixteen-bit input chunk and coupled to a bank of 2K×8 bit ROMs 54, 56, 57, 58, 60, 61, 62, 64, 66, 67, 68 and 70 or equivalent. A cycle count is provided as one of the address inputs to the ROMs so as to identify which of the sixteen-bit chunks is being processed. The ROMs contain the precomputed partial parities of the dot products of the data with appropriate portions of the H matrix, as hereinabove described. Each output, consisting of twenty-four bits, is applied to a bank of modulo-2 accumulators 72, 74 and 76 grouped in three sets. The outputs of the accumulators 72, 74 and 76 after the last sixteen bit chunk is received are the final syndromes Shd 1, $S_3$, and $S_5$. The final syndrome values are passed to the error location look-up circuit 42 (FIG. 2) to determine the locations of the errors.

FIG. 4 illustrates one embodiment showing principal features of the error location look-up circuit 42. The error location look-up circuit 42 comprises three data paths, one for each of the syndromes. The first data path comprises a first latch 78, which is eight bits wide, coupled to a first output ROM 80, coupled to a first level-adjusting circuit 82 and coupled to a first output register 84.

The second data path comprises a first input register 86 coupled to a second latch 88, which is eight bits wide, coupled to a first intermediate ROM 90, coupled to a second output ROM 92, coupled to a second level-adjusting circuit 94 which is finally coupled to a second output register 96.

The third data path comprises a second input register 100 coupled to a third latch 102, coupled to a second intermediate ROM 104, coupled to a third output ROM 106, coupled to a third level-adjusting circuit 108 which is finally coupled to a third output register 110.

In addition, the second and third intermediate ROMs 90 and 104 have four output bits which are coupled to a fourth level-adjusting circuit 112 and fourth output register which provide four output signals relating to errors.

First and second input ROMs 86 and 100 receive at least two of the syndromes as input and are used to look up the precomputed values of the shifted syndromes $(S_1^{-1})^3 S_3$ and $(S_1^{-1})^5 S_5$, respectively. This eliminates need for additional separate ROMs and multipliers for the individual multiplicands. The shifted syndromes are then applied to the intermediate ROMS 90 and 104 to look up the shifted error locations. In the case where $S_1 = 0$, the input ROMs 86 and 100 are not used. Rather, the value is fed to the first latch 78, which in turn has as its output applied to ROM 104 when $S_1 = 0$ and to ROM 90 otherwise. For both cases, the output of latch 78 is also applied to ROMs 80, 92 and 106. The intermediate ROMs 90 and 104 are used to look up the shifted error locations. They also provide as additional output information on how many errors occurred in the error pattern and whether the error pattern found is uncorrectable.

The values of the shifted error locations are then applied to the output ROMs 80, 92 and 106 along with the syndrome $S_1$ whereby the number of bits required to shift the error locations to correspond to unshifted error locations is determined. The level-adjusting circuits 82, 94 and 108, along with the output registers 84, 96 and 110, produce the sought-after error location numbers $N_1$, $N_2$ and $N_3$ for the error correction circuit 36, as shown in more detail in FIG. 5.

The error correction circuit 36 comprises a comparator section 116, a decoder section 118 and a bit stream corrector 120 whereby there is error correction of the input data stream on a sixteen-bit line 122. Error location numbers change only once per code word. The high error number bits indicate which of the sixteen data chunks contains errors, and the low error number bits indicate which bit within the data chunk is incorrect. The comparator section 116 receives the cycle count, indicating which sixteen-bit chunk is being processed, and compares it with the high-order bits of the error numbers. The comparator 116 outputs are ANDed (by AND gates 117, 119, 121) with the corresponding low bits of the error location numbers to provide three sets of four-bit input to corresponding four-bit-to-sixteen-bit decoders of the decoder section 118. The decoder section 118 converts the resultant binary values to one of sixteen bit positions for output. The three sixteen-bit-wide outputs of the decoder section 118 are ORed together by three-input OR gates 123 to form a single sixteen-bit error correcting value to match the sixteen bit data stream. The sixteen-bit data stream will have ones at the bit positions of incorrectly-received data. The sixteen bit data stream is then EXCLUSIVE-ORed (in a bank of two-input EXCLUSIVE OR gates forming bit stream corrector 120) to invert and thereby correct the corresponding bit in the data stream.

A specific embodiment of the invention as described above has been built and tested at data rates in the range of 1 GBPS. Substantially higher rates could be achieved by increasing the size of the data chunks from sixteen bits to thirty-two bits, for example. Conventional CMOS, TTL and ECL integrated circuits have been employed, with GaAs circuits used only for the serial/parallel conversions.

The invention has now been described with reference to specific embodiments. Other embodiments will be apparent to those of ordinary skill in the art. For example, the invention has been described with respect to a particular type of BCH code. The invention can be modified to apply to special cases of error correcting codes having similar characteristics, such as Reed-Solomon codes, which are nonbinary subsets of BCH codes. In addition, the invention applies to a wide variety of linear cyclic invariant codes whose generator polynomials can be factored. However, it is believed that less than all such codes can be decoded in accordance with selected embodiments of the invention. It is therefore not intended that this invention be limited, except as indicated in the appended claims.

We claim:

1. An apparatus for decoding in linear error correcting code, said decoding being at data speeds greater than direct computation capabilities of error computation circuitry, said apparatus comprising:
   first register means for temporarily storing a complete representation of an input code word;
   means for determining at least one syndrome to identify errors in said input code word;
   means coupled to said syndrome determining means for identifying from said at least one syndrome a corresponding error location in said input code word by table lock-up to maximize processing speed, said error location identifying means including a first memory means storing a cyclic invariant representation of error patterns for each syndrome to minimize the size of said memory means for use by table lock-up; and
   means coupled to said error location identifying means and to said first register means for correcting said input code word from said at least one syndrome.

2. The apparatus according to claim 1 wherein the error correcting code is selected from linear cyclic invariant error correcting codes whose generator polynomials can be factored, wherein said first memory means further comprises a first Read Only Memory means storing a cyclic invariant representation of said error patterns in order to minimize storage of information in said first memory means.

3. The apparatus according to claim 2 wherein said location identifying means further includes means for correlating bit position between actual error patterns and stored representations of said error patterns based on said cyclic invariant representation of said error pattern.

4. The apparatus according to claim 3 further including:
a serial-to-parallel converter coupled to receive input data in order to convert high-speed input data into parallel data to be processed at lower data speeds, said serial-to-parallel converter being coupled to provide said parallel data to said syndrome determining means.

5. The apparatus according to claim 1 wherein said syndrome determining means further comprises a second memory means storing indicia of possible errors in said input code word.

6. The apparatus according to claim 5 wherein said second memory further comprises a second Read Only Memory means storing at least partials of the parity of the bit-by-bit product of a received code word and rows of an H matrix representing a parity check characteristic of said code, said product corresponding to a corresponding bit of said at least one syndrome.

7. The apparatus according to claim 6 further comprising means for modulo-2 adding partial parities of said at least one syndrome to obtain said syndrome.

8. The apparatus according to claim 1 further comprising:
a serial-to-parallel converter coupled to receive input data in order to convert high-speed input data into parallel data to be processed at lower data speeds, said serial-to-parallel converter being coupled to provide said parallel data to said syndrome determining means.

9. The apparatus according to claim 1 wherein said second memory comprises a second Read Only Memory means storing at least partials of the parity of the bit-by-bit product of a received code word and rows of an H matrix representing a parity check characteristic of said code, said product corresponding to a corresponding bit of said at least one syndrome.

10. The apparatus according to claim 9 further comprising means for modulo-2 adding partial parities of said at least one syndrome to obtain said syndrome.

11. An apparatus for decoding a triple error correcting binary BCH code at data speeds greater than direct computation capabilities of error computation circuitry, said apparatus comprising:
first register means for temporarily storing a complete representation of an input code word;
means for determining a first syndrome, a second syndrome and a third syndrome to identify errors in said input code word, said syndrome determining means including a first memory means storing indicia of possible errors in said input code word;
means coupled to said syndrome determining means for identifying from said first syndrome, from said second syndrome and from said third syndrome error locations in said input code word by table look-up to maximize processing speed, said error location identifying means including a second memory means storing a cyclic invariant representation of error patterns for each said syndrome to minimize the size of said memory means for use by table look-up; and
means coupled to said error location identifying means and to said first register means for correcting said input code word from said first syndrome, said second syndrome and said third syndrome.

12. The apparatus according to claim 11 wherein said second memory means comprises a first Read Only Memory means storing a cyclic invariant representation of said error patterns in order to minimize storage of information in said second memory means.

13. The apparatus according to claim 12 wherein said location identifying means further comprises means for correlating bit position between actual error patterns and stored representations of said error patterns based on said cyclic invariant representation of said error pattern.

14. The apparatus according to claim 13 further comprising:
a serial-to-parallel converter coupled to receive input data in order to convert high-speed input data into parallel data to be processed at lower data speeds, said serial-to-parallel converter being coupled to provide said parallel data to said syndrome determining means.

15. The apparatus according to claim 14 wherein said second memory comprises a second Read Only Memory means storing at least partials of the parity of the bit-by-bit product of a received code word and rows of an H matrix representing a parity check characteristic of said code, said produce corresponding to a corresponding bit of said at least one syndrome.

16. The apparatus according to claim 15 further comprising means for modulo-2 adding partial parities of said at least one syndrome to obtain said syndrome.

17. A method for decoding a linear error correcting code, said decoding being at data speeds greater than direct computation capabilities of error computation circuitry, said method comprising the steps of:
temporarily storing a complete representation of an input code word;
determining at least one syndrome to identify errors in said input code word;
identifying from said at least one syndrome a corresponding error location in said input code word by table lock-up in a first memory means to maximize processing speed, said first memory means storing a cyclic invariant representation of error patterns for each syndrome to minimize the size of said memory means for use by table look-up; and
correcting said temporarily stored input code word using said error locations so identified.

18. The method according to claim 17 wherein said code is selected selected from linear cyclic invariant error correcting codes whose generator polynomials can be factored, and wherein said identifying step comprising comparing said at least one syndrome with a stored cyclic invariant representation of said error patterns in order to minimize storage of information in said first memory means.

19. The method according to claim 18 further including the step of correlating bit position between actual error patterns and stored representations of said error patterns based on said cyclic invariant representation of said error pattern.

20. A method for decoding a linear error correcting code, said decoding being at data speeds greater than direct computation capabilities of error computation circuitry, said method comprising the steps of:

temporarily storing a complete representation of an input code word;

determining at least one syndrome to identify errors in said input code word by comparing said input code word with precomputed indicia of possible errors in said input code word stored in a first memory means;

identifying from said at least one syndrome a corresponding error location by look-up in a table containing cyclic invariants of error locations in said input code word; and correcting said temporarily stored input code word using said error locations so identified.

21. A method for decoding a linear error correcting code, said decoding being at data speeds greater than direct computation capabilities of error computation circuitry, said method comprising the steps of:

temporarily storing a complete representation of an input code word;

determining at least one syndrome to identify errors in said input code word by comparing said input code word with precomputed indicia of possible errors in said input code word stored in a first memory means; wherein said determining step comprises comparing said input code word precomputed indicia including at least partials of the parity of the bit-by-bit product of a received code word and rows of an H matrix representing a parity check which is characteristic of said code, said product corresponding to a corresponding bit of said at least one syndrome;

identifying from said at least one syndrome a corresponding error location in said input code word; and correcting said temporarily stored input code word using said error locations so identified.

22. The method according to claim 21 wherein said determining step further comprises modulo-2 adding partial parities of said at least one syndrome to obtain said syndrome.

* * * * *